United States Patent [19]

Stoneham

[11] Patent Number: 5,789,801
[45] Date of Patent: Aug. 4, 1998

[54] VARACTOR WITH ELECTROSTATIC BARRIER

[75] Inventor: Edward B. Stoneham, Los Altos, Calif.

[73] Assignee: Endgate Corporation, Sunnyvale, Calif.

[21] Appl. No.: 555,777

[22] Filed: Nov. 9, 1995

[51] Int. Cl.$^6$ .................................................. H01L 29/93
[52] U.S. Cl. ........................ 257/597; 257/596; 257/598
[58] Field of Search .............................. 257/595, 596, 257/597, 598, 599, 600, 601, 602

[56] References Cited

U.S. PATENT DOCUMENTS

| 4,987,459 | 1/1991 | Kasahara | 257/597 |
| 5,336,923 | 8/1994 | Geddes et al. | 257/595 |
| 5,506,442 | 4/1996 | Takemura | 257/596 |

FOREIGN PATENT DOCUMENTS

| 55-29169 | 3/1980 | Japan | 257/595 |
| 58-162071 | 9/1983 | Japan | 257/596 |
| 2-33977 | 2/1990 | Japan | 257/596 |
| 2-191377 | 7/1990 | Japan | 257/596 |
| 4-56363 | 2/1992 | Japan | 257/595 |

Primary Examiner—Ngân V. Ngô
Attorney, Agent, or Firm—Steven J. Adamson; Edward B. Anderson

[57] ABSTRACT

A varactor comprising a substrate of semiconductor material on which is grown both an electrostatic barrier having a first layer of material doped with donor impurities and a second layer of material doped with acceptor impurities and a depletable layer. In other embodiments of the present invention varactors are provided that include a plurality of barrier and depletable layer pairs grown in a serial arrangement.

22 Claims, 3 Drawing Sheets

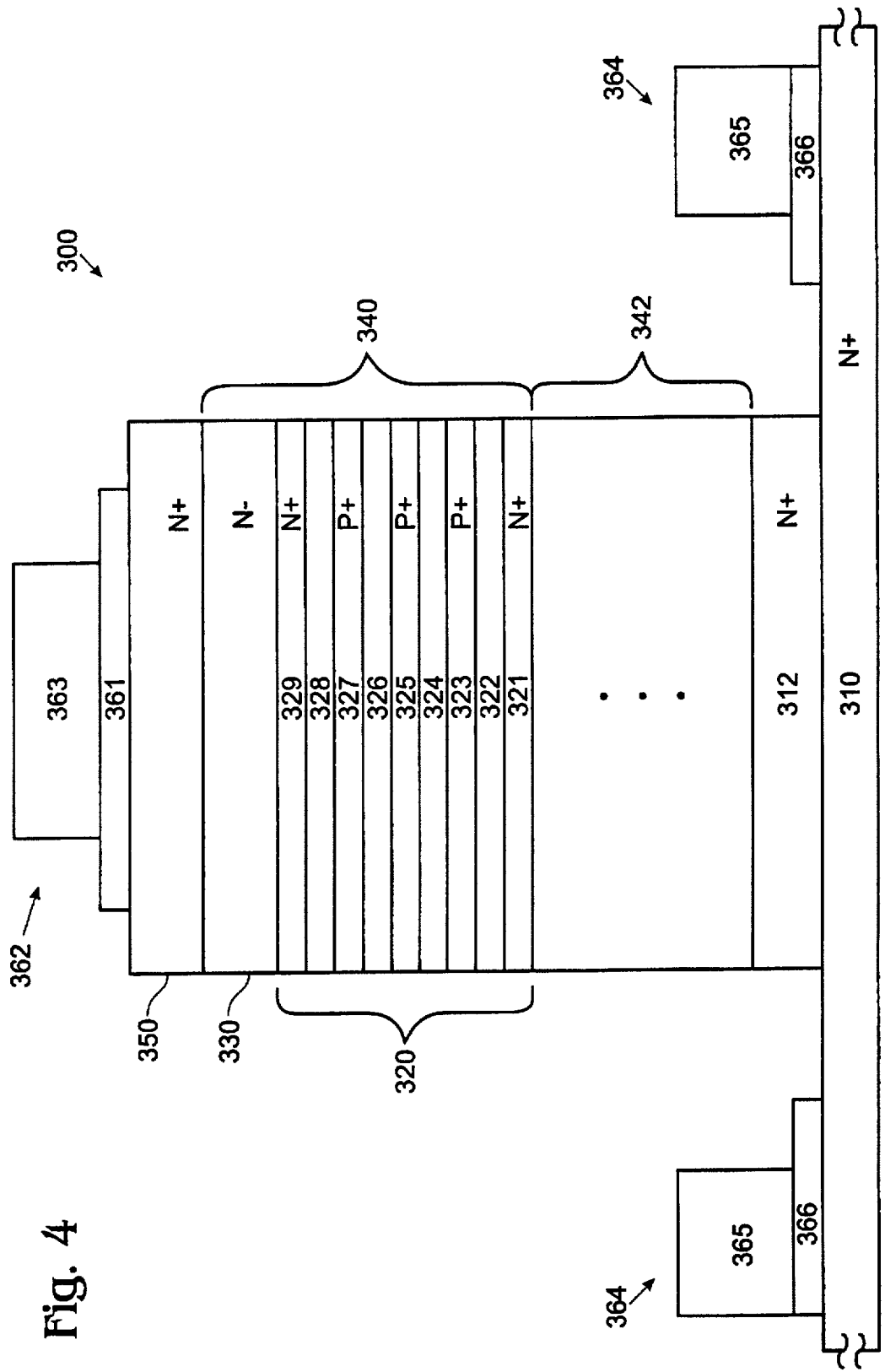

VARACTOR WITH ELECTROSTATIC BARRIER

FIELD OF THE INVENTION

The present invention relates to variable reactors, commonly referred to as varactors, and more specifically to barrier varactors.

BACKGROUND OF THE INVENTION

Varactors are widely used in electrical and electronic circuits in a variety of applications, including voltage-variable tuned circuits, voltage controlled oscillators, phase shifters, frequency multipliers, etc.

A well known problem in the use of varactors is the presence of leakage current. Leakage current generally refers to the movement of electrons in response to an externally applied reverse-voltage bias and may be caused by contaminants in the material or by thermal excitation of electron-hole pairs that are near or within the depletion layer. Leakage current lowers the quality factor, Q, and accordingly several prior art varactor designs have been directed towards its minimization.

One attempt to reduce leakage current in a type of varactor referred to as a barrier varactor includes the careful choice of materials and thicknesses to optimize the effectiveness of the barrier therein, such as the heterojunction barrier taught by Krishnamurthi, et al., in Chair-Barrier Varactors on GaAs for Frequency Triplers (1994 IEEE MTT-S Digest; CH3389-4/94/000-313) . Another attempt to reduce leakage current in such a varactor includes the use of a superlattice structure as taught by Raman, et al., in Superlattice Barrier Varactors (Proc. Third International Symposium on Space Terahertz Technology, pp. 146–157, 1992).

Though these improvements have achieved a reduction in leakage current compared to earlier barrier varactors, the level of leakage current reduction and/or the limitations in the temperature range over which the reduction is achievable may be less than desirable for present applications.

In addition to structural aspects of varactors, shortcomings are also present in prior art varactor fabrication methods and machinery. One of these shortcomings involves the accuracy of both the doping concentration and thickness for layers grown via molecular beam epitaxy (MBE), a common method of semiconductor device fabrication, or other epitaxial growth techniques. The problem is that significant variation may exist between the purported accuracy of epitaxial growth machines and their actual accuracy. Such variations are particularly disadvantageous in devices where a balance of charge carriers is desired.

SUMMARY OF THE INVENTION

Accordingly, it is an objective of the present invention to reduce leakage current in a varactor.

It is another objective of the present invention to provide leakage current reduction over a wide temperature range.

These and related objectives of the present invention are achieved by incorporation in a varactor of an electrostatic barrier in which thin layers of highly doped n and p type semiconductor material act to produce a potential barrier which impedes or reduces electron flow and which can be placed in juxtaposition with a layer of more lightly doped semiconductor material in the varactor to achieve the variable-capacitance property of the varactor with a high quality factor over the full capacitance range.

In a first embodiment of the present invention, the varactor comprises a substrate of semiconductor material; an electrostatic barrier formed on said substrate including a first layer of semiconductor material doped with one of the class of dopant impurities including donor and acceptor impurities and a second layer of semiconductor material doped with another of said class of dopant impurities; a depletable layer formed on said barrier; and contact regions in communication with said substrate and said depletable layer for facilitating application of an external voltage.

The varactor may also include spacer regions between the first and second layer of the barrier and between those layers and the depletable layer. The charge carrying layers of the barrier are preferably heavily doped and the barrier may be either of the homojunction or heterojunction type. Furthermore, a third layer of material may be included in the barrier that is doped with said one of said class of dopant impurities, the second layer being positioned between the first and third layers.

In another embodiment of the present invention, the varactor comprises a substrate of semiconductor material; a plurality of electrostatic barriers formed on said substrate each having a first layer of material doped with dopant impurities of a first type and a second layer of material doped with dopant impurities of a second type; and a plurality of depletable layers formed on said substrate; wherein said plurality of barriers and depletable layers are positioned in an alternating manner to form a series of barrier and depletable layer pairs on said substrate. The plurality of barriers preferably ranges from 2–15. The barriers of this varactor may also include a third layer of material doped with dopant impurities of said first type, the second layer being positioned between the first and third layers.

Spacer layers may be provided as appropriate to maintain the shape of the barrier and the barrier may be either of the homojunction and heterojunction types. Contact regions are provided in communication with the substrate and said serial arrangement of barrier and depletable layer pairs for facilitating application of an external bias.

The attainment of the foregoing and related advantages and features of the invention should be more readily apparent to those skilled in the art after review of the following more detailed description of the invention taken together with the drawings.

BRIEF DESCRIPTION OF THE DRAWINGS

FIG. 3b is a conduction band energy gap diagram for the n+p+n+ barrier of FIG. 3a.

FIG. 4 is a cross sectional view of a homojunction varactor made in accordance with the present invention.

DETAILED DESCRIPTION

A varactor device is taught herein making reference to embodiments which contain certain arrangements of acceptor doped and donor doped layers. For example, in at least one embodiment below an n+p+n+ barrier is disclosed. It should be recognized that the doping types of these doped layers and the associated externally applied voltage can be reversed or otherwise modified as known in the art, for example, to produce a functioning varactor having a p+n+p+ barrier, without deviating from the present invention.

Figure 1:
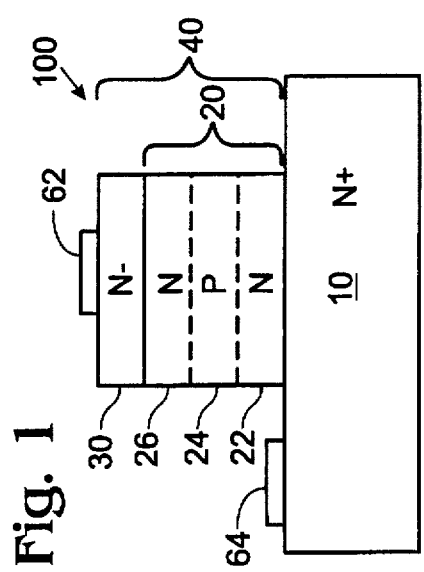
FIG. 1 is a cross sectional view of a varactor in accordance with the present invention.

Referring to FIG. 1, a cross sectional view of a basal varactor in accordance with the present invention is shown. This varactor 100 is grown on a substrate 10 of semiconductor material using molecular beam epitaxy (MBE). The substrate 10 is preferably GaAs, though it may be InP, Si, GaInAsP or any other semiconductor material that can be doped n or p type. One aspect of the selected substrate semiconductor is that it is capable of carrying current, particularly along its surface. In the preferred embodiment, the GaAs substrate is heavily doped with donor impurities (n+) to facilitate conductivity.

A multi-layer barrier 20 is grown (directly or indirectly) on the substrate 10. The barrier 20 comprises a first layer of semiconductor material 22 or 26 doped with donor impurities and a second layer of semiconductor material 24 doped with acceptor impurities. These two layers 24 and 22 or 26 are grown in either direct contact or in close proximity to one another such that the acceptor doped layer 24 can trap mobile electrons from the adjacent donor doped layer 22 or 26.

It should be recognized that in addition to being grown either below or above acceptor layer 24, the donor layers 22 and 26 may be provided both above and below acceptor doped layer 24. Layer 24 is shown in dashed lines to indicate this arrangement of being either above, below or within donor doped layers 22 and 26. A characteristic of barrier 20 is that, regardless of whether the donor doped regions are provided above, below or both, the total amount of acceptors atoms is approximately equal to the total amount of donor atoms.

A layer of semiconductor material lightly doped with donor impurities (n−) is preferably grown on barrier 20. This layer is referred to herein as the depletable layer 30 because at room temperature with forward bias applied to varactor 100 it is not depleted, while under the application of a reverse bias it is substantially depleted.

To permit the application of an external voltage to varactor 100, contact regions 62,64 are provided.

Operation of varactor 100 is generally as follows. In the absence of an externally applied voltage, there is no appreciable internal current flow. In the presence of a reverse voltage (negative supply at contact region 64), however, electrons in the n- layer 30 are displaced toward contact region 62, to which the positive electrode is connected, until layer 30 is partially or fully depleted of electrons. The barrier 20 acts as a barrier to further electron flow, because acceptor impurities in the p layer 24, having trapped electrons from the adjacent n layers 22 and/or 26, are negatively charged. In its negatively charged state, the p layer 24 repels electrons impeding their passage and resulting in a reduction of leakage current, i.e., electron flow, across depletable layer 30. The "electrostatic" barrier of the present invention arises from this charging of the acceptor doped layer which occurs while the donor doped layers are becoming positively charged due to donation of their electrons. The resultant adjacent negatively and positively charged regions form the electrostatic barrier.

The varactor 100 is preferably made of GaAs, but may also be made of other known material such as InP, Si, or GaInAsP or any other semiconductor material that can be doped n- or p-type. Heterojunction barriers are also contemplated in which the barrier contains AlGaAs or other material as is known in the art.

Figure 2:
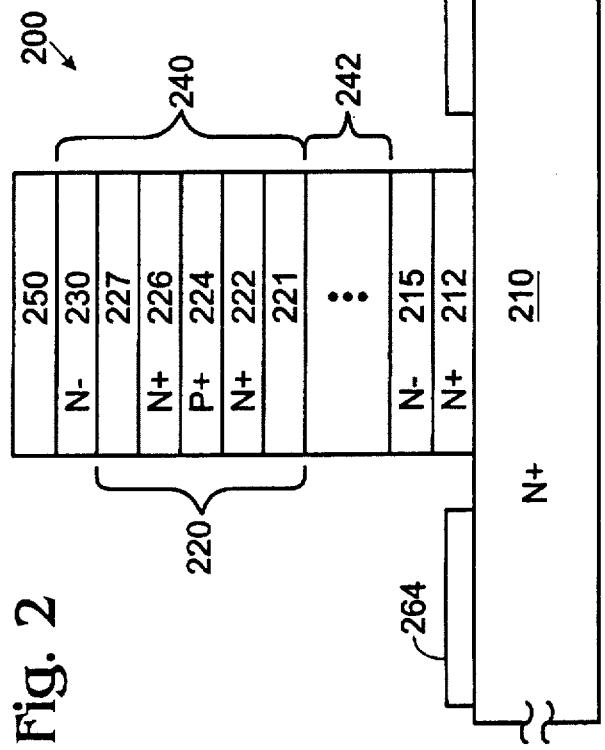
FIG. 2 is a cross sectional view of another embodiment of a varactor in accordance with the present invention.

Referring to FIG. 2, another embodiment of a varactor in accordance with the present invention is shown. This varactor 200 illustrates several additional aspects of the present invention, including, but not limited to, the use of buffer layers, spacer layers, a repeating structure of barrier and depletable layer pairs and the use of a Schottky contact device.

The substrate is preferably GaAs or other suitable semiconductor material as discussed above for substrate 10. A buffer layer 212 is grown on substrate 210 to isolate the remaining layers in varactor 200 from the effects of impurities and surface irregularities associated with substrate 210.

A depletable layer 215 is grown on layer 212. Adding layer 215 and making the layer structure symmetrical about each barrier gives the varactor a symmetrical capacitance-versus-voltage characteristic which is ideal for applications such as frequency multiplication by generation of odd harmonics.

In FIG. 1, a varactor is disclosed that comprises a single barrier and depletable layer pair 40. In FIG. 2, a varactor is disclosed that comprises a serial arrangement of units each one of which comprises a barrier and depletable layer pair 240. One reason for the use of serially arranged barrier and depletable layer pairs is that they provide enhanced leakage current reduction, compared to a varactor having a single barrier/depletable layer pair 40. Another reason is that the detrimental effect on quality factor of contact resistance is reduced in inverse proportion to the number of variable-capacitance units (barrier/depletable layer pairs) that are in series with the contacts. This occurs because the contact resistance is a fixed quantity independent of the number of variable-capacitance units in series while the intrinsic resistance of the varactor is proportional to the number of variable-capacitance units in series. Thus, the contact resistance constitutes a smaller and smaller fraction of the total series resistance of the varactor as the number of variable-capacitance units increases and thus degrades the quality factor less and less.

Reference number 242 is used to represent repeats of one or more of the barrier/depletable layer pair 240. The number of pairs at 242 may range from one to a number limited by those characteristics discussed below with reference to FIG. 4. In general, however, the number of repetitions of barrier/depletable layer pairs 240 should be higher than two to achieve high Q and high power capability with improved linearity.

Layers 221 and 227 are spacer layers and may be formed of InGaAs, GaAs, AlGaAs or the like and may have little or no doping. A purpose of spacer layers is to shape the barrier so that it retains a sufficient height and width throughout the range of bias that needs to be applied to it. Sufficient height and width in this context refers to maintaining leakage current due to diffusion and tunneling below a level at which varactor characteristics would be degraded.

The barrier of varactor 200 is composed of layers 222, 224 and 226 which are, respectively, donor doped, acceptor doped and donor doped. These layers are analogous to layers 22, 24 and 26 of varactor 100 (assuming all three layers are provided in varactor 100) and are preferably made of GaAs and heavily doped with their respective impurities.

Layer 230 is a depletable layer. This layer is analogous to layer 30 of varactor 100. Depletable layer 230 is preferably formed of GaAs and lightly doped with donor impurities.

A Schottky barrier metal layer 250 is provided as the topmost layer, i.e., the layer to which electrical connection to an external bias is made. A Schottky device is used for this purpose because as is known in the art a Schottky barrier has no ohmic contact resistance. Although a Schottky barrier may provide this desirable attribute, depending on the conditions of operation and desired varactor characteristics, a Schottky barrier may not be preferred as discussed below with reference to FIG. 4.

Figure 3A:
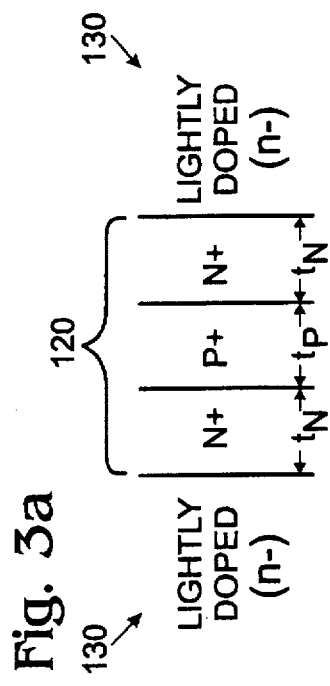
FIG. 3a is a schematic diagram of an n+p+n+ barrier in accordance with the present invention.

Referring to FIG. 3a, a schematic diagram of an electrostatic barrier 120 flanked on both sides by depletable layers 130 is shown. If $2n \cdot t_n = p \cdot t_p$, where n is the net n type doping concentration in each n+ layer, p is the net p type doping concentration in the p+ layer and $t_n$ and $t_p$ are the respective n+ and p+ layer thicknesses, and if $n \cdot t_n$ and $p \cdot t_p$ are such that the n+ and p+ layers are completely depleted of carriers, then the conduction band potential in the absence of an externally applied field has the shape shown in FIG. 3b. The barrier height $\phi_b$ can range from 0 volts to the band gap of the material, depending on the choice of n, p, $t_n$ and $t_p$.

Figure 3B:
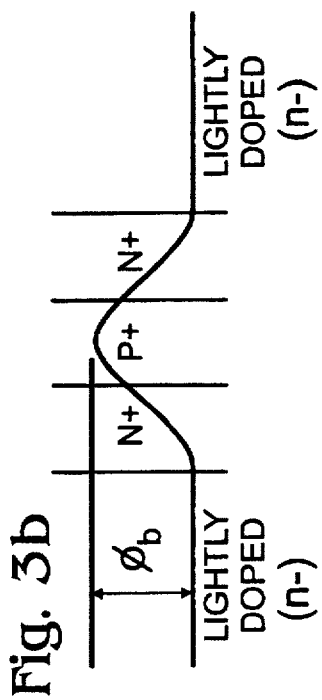
Figure 3C:
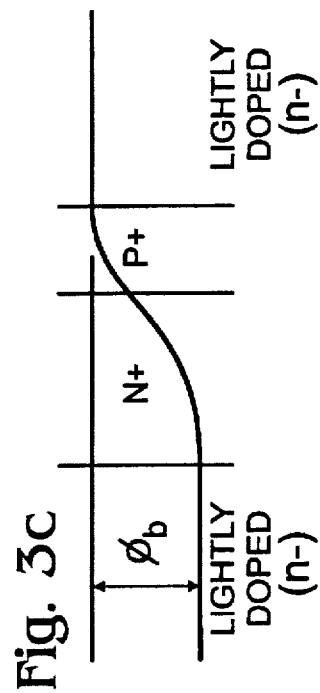
FIG. 3c is a conduction band energy gap diagram for an asymmetrical barrier.

While the electrostatic barrier depicted in FIGS. 3a–3b is symmetrical, it may be desirable in some cases to make the barrier unsymmetrical. This can be achieved through changes in the relative doping concentrations or thicknesses of the layers. One relatively extreme example of this case is shown in FIG. 3c in which the p+ layer is moved all the way to one side of the barrier to form an asymmetrical barrier consisting of two layers only.

Figure 5:
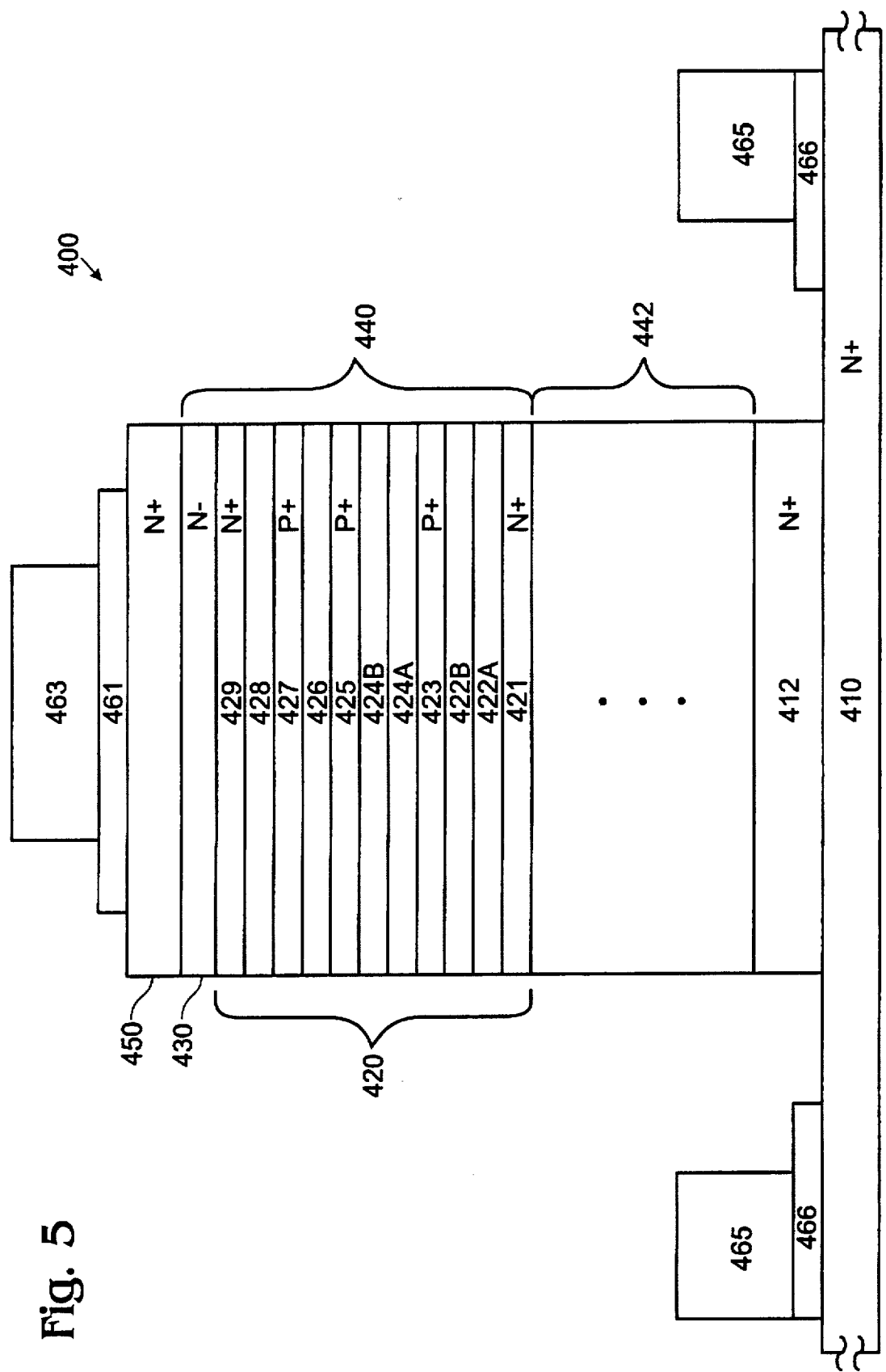
FIG. 5 is a cross sectional view of a heterojunction varactor made in accordance with the present invention.

As illustrated in FIGS. 4–5 below, this electrostatic barrier may be implemented in both homojunction and heterojunction varactors. Furthermore, with respect to the above-cited heterojunction barrier varactor of Krishnamurthi, et al., the n+p+ or n+p+n+ barriers of FIGS. 1 and FIGS. 2–3, respectively, can either replace their heterojunction barrier or be superimposed on the heterojunction barrier.

Having generally introduced the electrostatic barrier of the present invention and its configuration in n+p+ and n+p+n+ layers, and further having introduced the serial arrangement of barrier and depletable layer pairs to reduce both leakage current and the effects of ohmic contact resistance on Q, more specific embodiments of the present invention are now disclosed.

Referring to FIG. 4, a cross sectional view of a homojunction barrier varactor 300 in accordance with the present invention is shown. As the name homojunction implies, each layer of material in varactor 300 is the same in its basic composition, and in a preferred embodiment that material is GaAs, though as above several other known materials may be suitable.

The substrate 310 is formed of GaAs heavily doped with donor impurities. A buffer layer 312, analogous to buffer layer 212 of varactor 200, is the first layer grown on substrate 310. It is preferably n+ doped GaAs.

Following layer 312 a series of repeated barrier and depletable layer pairs 340 are grown.

In the embodiment of FIG. 4, each of the barriers 320 preferably has nine layers, including n+, p+ and undoped layers, arranged as follows. A first layer 321 of n+ doped GaAs is grown on layer 312 or on a preceding depletable layer and an undoped GaAs spacer layer 322 is grown on layer 321. The purpose of spacer layer 322 is to reduce tunneling and to shape the barrier so that it retains sufficient height and width through the range of bias applied to it to maintain leakage current below certain levels. The acceptor doped region of the barrier 320 is formed in three layers. A first p+ layer 323 is grown on spacer layer 322, and the second and third p+ layers 325 and 327 are grown on undoped spacer layers 324 and 326, respectively. An undoped spacer layer 328 is grown on the top p+ layer 327 and a second n+ layer 329 is grown on spacer layer 328. Layers 321, 323, 325, 327, 329 form the n+p+n+ structure of the barrier 320.

The depletable layer 330 is grown on the second n+ layer 329 and is preferably lightly doped with donor impurities.

In a preferred embodiment, the number of repetitions at 342 is seven so that eight barrier/depletable layer pairs are provided in total. Considerations governing the number of repetitions involve certain trade-offs which are generally as follows. The larger the number of repetitions the greater the reduction in leakage current. However, as the number of layers and overall thickness increases several problems arise. After fabrication of the stack of constituent layers, individual devices are defined by etching to form mesas. Etching to form mesas results in devices that have sloped sides due to greater etching at the top than at the bottom. The thicker the mesa, the greater the horizontal area occupied by the sloped sides and hence the greater the distance between adjacent varactors. The increased distance between adjacent devices both reduces yield per wafer and increases the series resistance of each device. Resolution may also suffer due to thick photoresist and deep etching, etc., that accompanies thick mesa processing. Theoretical expectations of device performance can also be thrown off by areal differences between bottom layers and top layers when mesas are exceptionally thick.

Another consideration is voltage. As a general rule, each time the number of layers is doubled, the amount of the power supply voltage required to operate the varactor over its full capacitance range is doubled. This is a practical limit to the number of repetitions of barrier/depletable layer pairs.

Layer 350 is grown on barrier and depletable layer pair 340 and is provided to facilitate good ohmic contact. Ohmic contacts 361 and 366 are formed on layer 350 and on the substrate 310, respectively. One reason for using an ohmic contact 361 at the top of varactor 300, as opposed to a Schottky barrier as disclosed in varactor 200 above, is that without a Schottky device each barrier of varactor 300 contributes approximately the same proportionate amount of voltage drop, regardless of the overall applied voltage level, thus preventing or minimizing potential hysteresis effects. Hysteresis can occur if barrier-depletable layer pairs differ from one another in their capacitance-voltage or current-voltage characteristics. In this case, a steady state (after a change in bias) is reached only after a relatively lengthy period of charge redistribution by way of leakage currents.

Reference numerals 363 and 365 represent pad metal connected to the ohmic contacts 361 and 366, respectively.

Though actual doping levels and layer thicknesses may vary depending on performance criteria and the environment within which a varactor is to be used as is known in the art, suitable thicknesses and dopant levels for carrying out the present invention in the embodiment of FIG. 4 are generally as follows. Layer 312 has a thickness of 3000 Å and an n type doping concentration of $4 \times 10^{18}$ cm$^{-3}$; layer 321 has a thickness of 160 Å and an n type doping concentration of $4 \times 10^{18}$ cm$^{-3}$; undoped layers 322 and 328 each have a thickness of 75 Å; undoped layers 324 and 326 each have a thickness of 100 Å; the first and third acceptor doped layers 323,327 each have a thickness of 28.5 Å and a p type doping concentration of $1 \times 10^{19}$ cm$^{-3}$; p+ layer 325 has a thickness of 24 Å and a p type doping concentration of $1 \times 10^{19}$ cm$^{-3}$; layer 329 has a thickness of 72 Å and an n type doping concentration of $4 \times 10^{18}$ cm$^{-3}$; the depletable layer 330 has a thickness of 1425 Å and an n type doping concentration of $2 \times 10^{17}$ cm$^{-3}$; and layer 350 has a thickness of 3000 Å and an n type doping concentration of $4 \times 10^{18}$ cm$^{-3}$.

A general consideration in choosing the thickness of each of the doped layers in the barrier is that it is desired to trap all carriers in the adjacent semiconductor material doped with the opposite type atom so that there are no mobile carriers. This is not achieved if the doped barrier layers are so thick that the barrier potential approaches the band gap.

Another consideration in choosing the thicknesses of the doping layers in the embodiment of FIG. 4 is the desire to have slightly more donors than acceptors in the barrier so that in no case within the range of epitaxial growth tolerances will there be an excess of acceptors. An excess of acceptors would reduce the maximum capacitance achievable at the maximum-capacitance bias voltage, because it would result in partial depletion of the depletable layers regardless of bias voltage.

An additional consideration in choosing the thicknesses and spacings of the doped layers in the embodiment of FIG. 4 is a desire to achieve a maximal capacitance range. This results in the choice of an asymmetrical barrier.

Referring to FIG. 5, a cross sectional view of a heterojunction barrier varactor 400 in accordance with the present invention is shown. In contrast to the homojunction varactor 300, the heterojunction varactor 400 contains more than one type of material. For example, in the embodiment of FIG. 5, portions of the barrier 420 contain AlGaAs and InGaAs whereas the depletable layer and remaining layers are formed of GaAs. It should be recognized that other materials, such as those listed above with reference to FIGS. 1-2 and the like, could be used to fabricate varactor 400.

The substrate 410, first layer 412 and repeating barrier and depletable layer pair 440 of FIG. 5 are analogous to their counterparts 310, 312 and 340 in FIG. 4, respectively. The composition of the heterojunction barrier 420, however, is different from that of homojunction barrier 320.

The barrier 420 has eleven layers. The n+p+n+ or electrostatic region is formed by layers 421, 423, 425, 427, 429 which are doped n+,p+,p+,p+,n+, respectively. The n+ and p+ layers are formed of GaAs. Spacer layer 422 is composed of a first layer 422a that is formed of In$_x$Ga$_{1-x}$As, where x varies from 0.10 to 0.25 in a linear grade from bottom to top, and a second layer 422b that is formed of Al$_{0.4}$Ga$_{0.6}$As. The use of AlGaAs and InGaAs has been shown by Krishnamurthi, et al., to be effective in reducing leakage current.

Spacer layer 424 is composed of a first layer 424a formed of AlAs and a second layer 424b formed of Al$_{0.4}$Ga$_{0.6}$As. Spacer layer 426 and 428 are single layers of Al$_{0.4}$Ga$_{0.6}$As.

Reference numeral 442 represents repetitions of the barrier/depletable layer pairs 440. In a preferred embodiment the barrier/depletable layer pair 440 is repeated nine times at 442.

Ohmic contacts 461, 466 and pad metal 463, 465 are provided as above in FIG. 4.

Suitable thicknesses and dopant levels for carrying out the present invention in the embodiment of FIG. 5 are generally as follows. Layer 412 has a thickness of 3000 Å and an n type doping concentration of $4 \times 10^{18}$ cm$^{-3}$; layers 421 and 429 have respective thicknesses of 125 Å and 65 Å and an n type doping concentration of $4 \times 10^{18}$ cm$^{-3}$; undoped spacer layers 422a and 422b have respective thicknesses of 70 Å and 112 Å; layers 423, 425, 427 have p type doping concentrations of $1 \times 10^{19}$ cm$^{-3}$ and respective thicknesses of 12.5 Å, 25 Å, and 26 Å; undoped spacer layers 424a and 424b have respective thicknesses of 20 Å and 30 Å; undoped spacer layers 426 and 428 have respective thicknesses of 40 Å and 50 Å; depletable layer 430 has a thickness of 1780 Å in one preferred embodiment and 1430 Å in another preferred embodiment with n type doping concentrations of $2 \times 10^{17}$ cm$^{-3}$ and $1 \times 10^{17}$ cm$^{-3}$, respectively; and layer 450 has a thickness of 3000 Å and an n type doping concentration of $4 \times 10^{18}$ cm$^{-3}$.

While the invention has been described in connection with specific embodiments thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention and the limits of the appended claims.

I claim:

1. A varactor, comprising:

a substrate of semiconductor material;

an electrostatic barrier formed on said substrate and including a first layer of semiconductor material doped with one of the class of dopant impurities including donor and acceptor impurities and a second layer of semiconductor material doped with another of said class of dopant impurities;

a depletable layer formed on said barrier; and contact regions in communication with said substrate and said depletable layer for facilitating application of an external voltage.

2. The varactor of claim 1, further comprising:

a spacer layer positioned between said depletable layer and said barrier.

3. The varactor of claim 1, further comprising:

a spacer layer positioned between said first layer and said second layer of the barrier.

4. The varactor of claim 1, further comprising:

a plurality of said depletable layers; and a plurality of barriers;

wherein said plurality of depletable layers and barriers are positioned in an alternating manner to form a series of barrier and depletable layer pairs on said substrate.

5. The varactor of claim 4, further comprising a spacer layer between two of said serially positioned depletable layer and barrier pairs.

6. The varactor of claim 1, wherein said first layer of semiconductor material is heavily doped with donor impurities.

7. The varactor of claim 1, wherein said second layer of semiconductor material is heavily doped with acceptor impurities.

8. The varactor of claim 1, wherein said depletable layer and said first and second layers are formed of the same semiconductor material.

9. The varactor of claim 1, wherein at least one of said depletable layer and said first and second layers are formed of a different semiconductor material.

10. The varactor of claim 1, wherein said depletable layer is formed of GaAs.

11. The varactor of claim 1, wherein said barrier further comprises a third layer of semiconductor material doped with said one of said class of dopant impurities, said second layer positioned between said first and third layers.

12. A varactor, comprising:

a substrate of semiconductor material;

a plurality of electrostatic barriers formed on said substrate each having a first layer of material doped with donor impurities and a second layer of material doped with acceptor impurities; and a plurality of depletable layers formed on said substrate;

wherein said plurality of barriers and depletable layers are positioned in an alternating manner to form a series of barrier and depletable layer pairs on said substrate.

13. The varactor of claim 12, wherein said plurality of barriers ranges from 2–15.

14. The varactor of claim 12, wherein each of said barriers includes a third layer of material doped with donor impurities, said second layer being positioned between said first and third layers.

15. The varactor of claim 14, wherein said first, second and third layers are heavily doped.

16. The varactor of claim 12, further comprising a spacer layer for retaining barrier shape grown between at least one of said plurality of barriers and one of said plurality of depletable layers.

17. The varactor of claim 12, wherein said plurality of barriers comprises a spacer layer for retaining barrier shape positioned between said first and said second layers.

18. The varactor of claim 12, wherein said plurality of barriers and said plurality of depletable layers are formed of the same material.

19. The varactor of claim 12, wherein at least one of said barriers is a heterojunction barrier.

20. The varactor of claim 12, further comprising contact regions in communication with said substrate and said serial arrangement of barriers and depletable layers for facilitating application of an external bias.

21. The varactor of claim 11, wherein said third layer is positioned between said second layer and said depletable layer and said first layer and said depletable layer are doped with said one of said class of dopant impurities.

22. A varactor, comprising:

a substrate of semiconductor material;

an electrostatic barrier formed on said substrate and including at least a first layer of semiconductor material doped with one of the class of dopant impurities including donor and acceptor impurities and a second layer of semiconductor material doped with another of said class of dopant impurities;

a depletable layer formed on said barrier, said second layer being formed between said first layer and said depletable layer and said first layer and said depletable layer being doped with said one of said class of dopant impurities; and and contact regions in communication with said substrate and said depletable layer for facilitating application of an external voltage.

* * * * *